(12) United States Patent
Schiff

(10) Patent No.: US 7,592,718 B1  
(45) Date of Patent: Sep. 22, 2009

(54) BOOSTED SWITCH DRIVE WITH CHARGE TRANSFER

(75) Inventor: Tod F. Schiff, Portland, OR (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 291 days.

(21) Appl. No.: 10/976,196

(22) Filed: Oct. 26, 2004

Related U.S. Application Data

(60) Provisional application No. 60/598,666, filed on Aug. 2, 2004.

(51) Int. Cl.
*H01H 9/54* (2006.01)

(52) U.S. Cl. .................. 307/130; 307/113

(58) Field of Classification Search .......... 307/130, 307/113
See application file for complete search history.

(56) References Cited

U.S. PATENT DOCUMENTS

| | | | |
|---|---|---|---|
| 5,646,894 A * | 7/1997 | Lin et al. ............... | 365/189.09 |
| 5,943,200 A * | 8/1999 | He ........................ | 361/56 |
| 5,969,964 A * | 10/1999 | Mangtani ............... | 363/132 |
| 5,998,981 A * | 12/1999 | Houghton et al. ...... | 323/282 |
| 6,683,441 B2 | 1/2004 | Schiff et al. ........... | 323/222 |
| 6,943,535 B1 | 9/2005 | Schiff .................... | 323/246 |
| 7,148,662 B2 * | 12/2006 | Kato ..................... | 323/222 |
| 2005/0073866 A1 * | 4/2005 | Cummings ............. | 363/63 |
| 2006/0244428 A1 * | 11/2006 | Jitaru et al. ............ | 323/222 |

* cited by examiner

Primary Examiner—Albert W Paladini  
Assistant Examiner—Hal I Kaplan  
(74) Attorney, Agent, or Firm—Robert F. Hightower

(57) ABSTRACT

A switch drive circuit utilizes charge transfer within and/or between boost circuit and/or snubber circuits for boosted switch drives. A boost circuit may include a divider to limit a boosted signal for driving a switch. A snubber circuit may transfer charge to a boost circuit.

23 Claims, 2 Drawing Sheets

BOOSTED SWITCH DRIVE WITH CHARGE TRANSFER

This application claims priority from U.S. Provisional Application Ser. No. 60/598,666 entitled Gate Drive and Snubber for Switching Power Supply, filed Aug. 2, 2004, which is incorporated by reference.

BACKGROUND

FIG. 1 illustrates a prior art gate drive circuit for a switching power supply. The circuit of FIG. 1 includes two transistors Q1 and Q2 connected to a switch node SW and arranged to alternately switch an inductor between two different power supply terminals PS and GND. This type of switch arrangement is commonly used in switching power supplies such as a synchronous buck converter. Transistors Q1 and Q2 are controlled by input signals $IN_1$ and $IN_2$ which drive the gates of Q1 and Q2 through drive circuits 10 and 12, respectively.

Drive circuit 12 can receive its power from the positive power supply terminal PS because the source of Q2 is referenced to the power supply ground terminal GND. However, the source of Q1 is referenced to the switch terminal SW which is at nearly the same voltage as PS when the gate of Q1 must be driven with a significantly higher voltage than PS. Therefore, the circuit of FIG. 1 includes a boost circuit 14 to generate a boosted power supply BST which is used to operate the drive circuit 10 for Q1. Boost circuit 14 includes a diode $D_B$ and capacitor $C_B$ connected in a charge pump arrangement.

The circuit of FIG. 1 also includes an RC snubber circuit 16 which dampens voltage spikes at the switch terminal SW caused by parasitic inductances in the transistors, the PC board on which they may be mounted, as well as the main inductor for the switching power supply.

DETAILED DESCRIPTION

Figure 1:
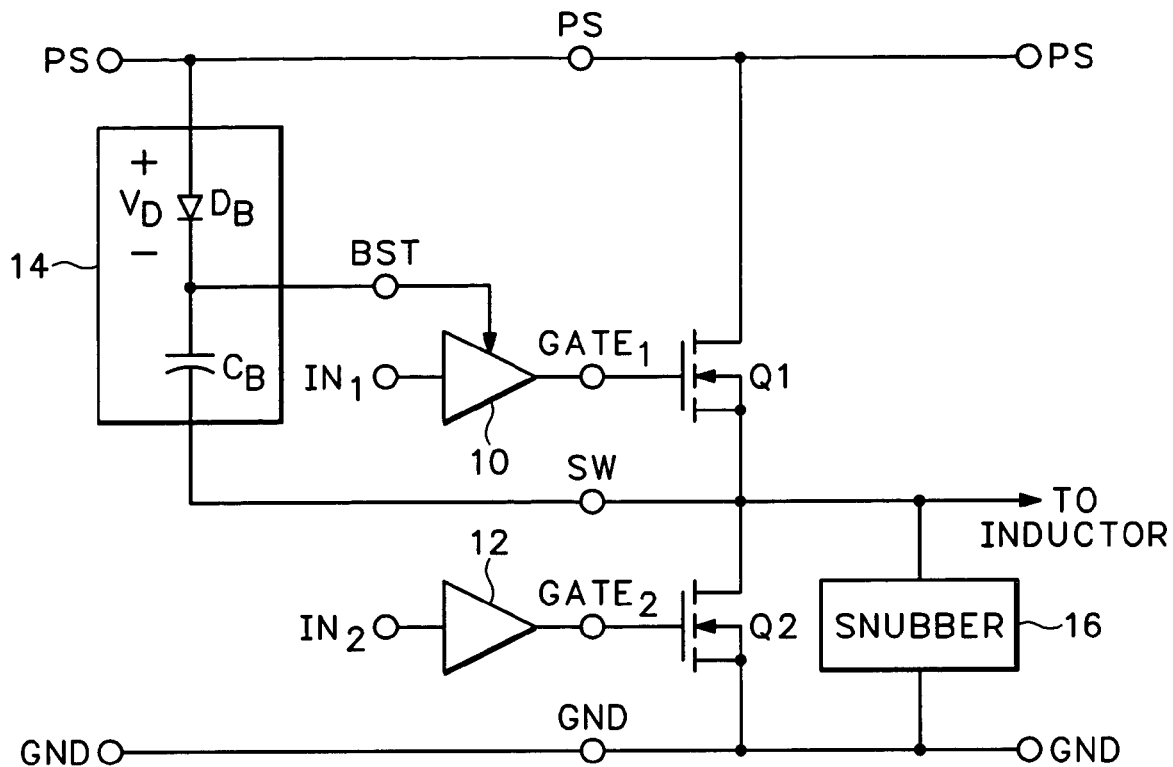
FIG. 1 illustrates a prior art gate drive circuit for a switching power supply.

Referring to the circuit of FIG. 1, as an operational example, the power supply PS is assumed to be at a positive voltage $V_{PS}$, and the power supply terminal GND is assumed to be at ground potential. Capacitor $C_B$ in the boost circuit is charged to $V_{PS}-V_D$ when the low-side transistor Q2 is turned on, that is, when the switch node SW is grounded through Q2 (except for any resistive drop through Q2). This capacitor voltage is driven onto the gate of high-side transistor Q1 through driver 10 when input $IN_1$ is activated. The capacitor voltage added to the voltage at the switch node SW when Q1 is on creates the boost voltage $V_{BST}$ at the boost terminal BST. This places almost the full supply voltage $V_{PS}$ (minus diode drop) across the gate-source input of Q1 and requires $C_B$ to store enough charge to charge up the gate capacitance of Q1 to almost the full supply voltage. This can cause high switching losses due to the large amount of charge involved.

One possible technique for reducing the switching losses is to provide a lower supply voltage to the boost circuit 14, i.e., not connect it directly to PS. The reduced supply voltage would need to be high enough to generate a boost voltage $V_{BST}$ that turns the high-side transistor Q1 completely on so as to minimize conduction losses through Q1, but low enough to minimize switching losses. There would typically be an optimum reduced supply voltage that would result in an optimum boost voltage, but the reduced supply voltage would usually have to be generated by a special circuit that adds cost and complexity to the system.

Another potentially problematic aspect of the circuit of FIG. 1 is the power loss in the snubber circuit 16. In many situations, a snubber circuit may be essential to prevent voltage spikes from damaging transistors Q1 and Q2. However, a substantial amount of charge is shunted to ground through the snubber, thereby wasting power and reducing efficiency.

Figure 2:
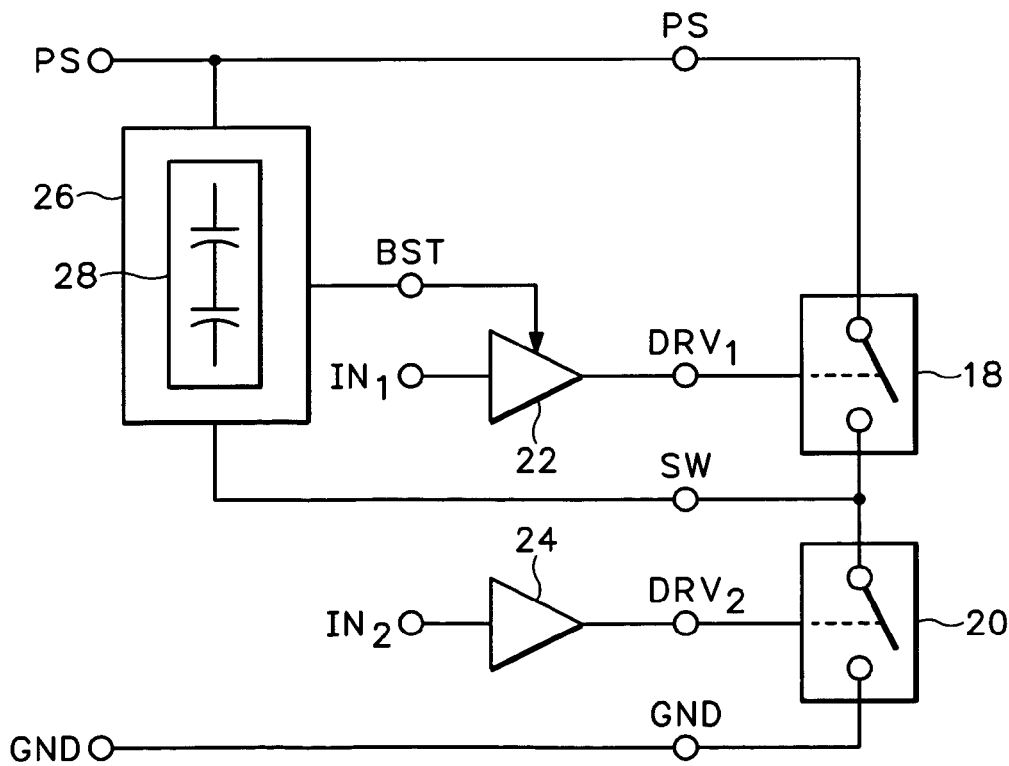
FIG. 2 illustrates an embodiment of a circuit according to some of the inventive principles of this patent disclosure.

Some of the inventive principles of this patent disclosure relate to transferring charge within and/or between boost circuits and/or snubber circuits. FIG. 2 illustrates an embodiment of a circuit that transfers charge according to some of the inventive principles of this patent disclosure. The circuit of FIG. 2 includes a first switch 18 arranged between a power supply terminal PS and a switch node SW and controlled by a drive signal at drive node $DRV_1$. A second switch 20 is arranged between SW and a second power supply terminal GND and controlled by a second drive signal at a second drive node $DRV_2$. The drive signals $DRV_1$ and $DRV_2$ are generated by drive circuits 22 and 24 in response to switch input signals $IN_1$ and $IN_2$, respectively.

A boost circuit 26 generates a boosted signal $V_{BST}$ at boost node BST to operate the drive circuit 22. The boost circuit includes a divider circuit 28, shown conceptually in this example as a capacitive divider that transfers charge between components to limit the boosted signal.

Figure 3:
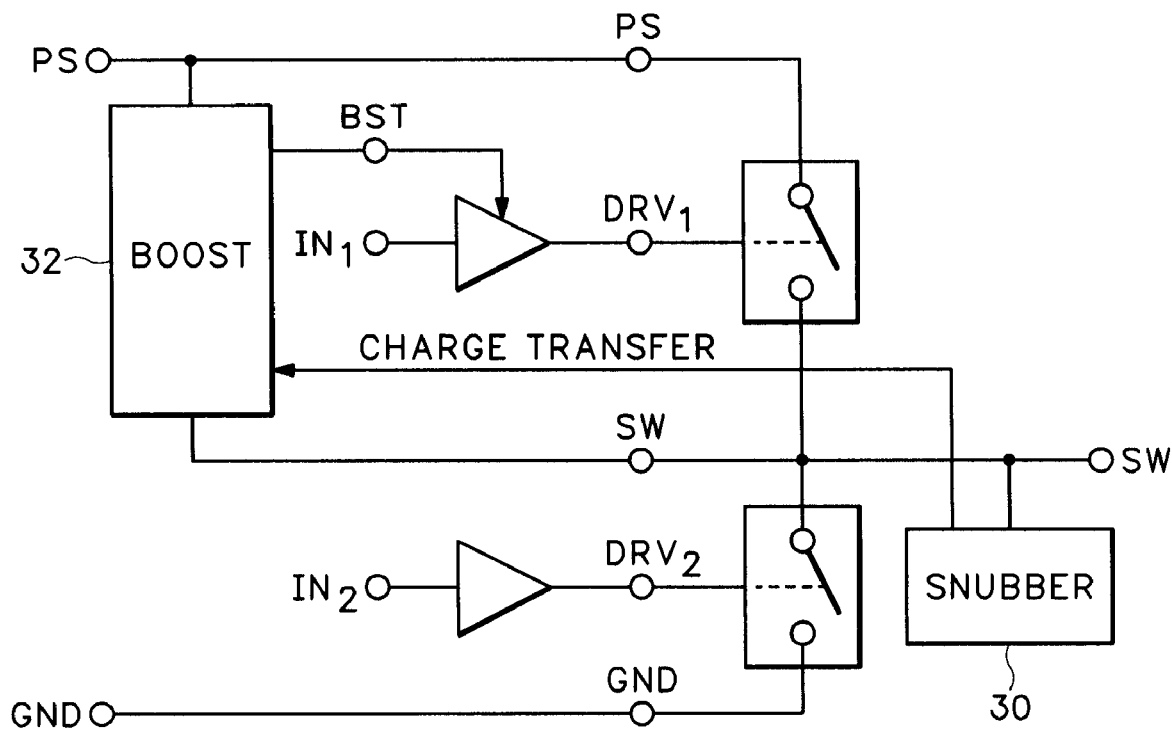
FIG. 3 illustrates another embodiment of a circuit according to some of the inventive principles of this patent disclosure.

FIG. 3 illustrates another embodiment of a circuit that transfers charge according to some of the inventive principles of this patent disclosure. The circuit of FIG. 3 includes switches 18 and 20 and drive circuits 22 and 24 arranged in the same manner as the circuit of FIG. 2. The circuit of FIG. 3, however includes a snubber circuit 30 arranged to transfer charge to a boost circuit 32 which generates a boosted signal $V_{BST}$ for providing power to drive the switch 18.

Figure 4:
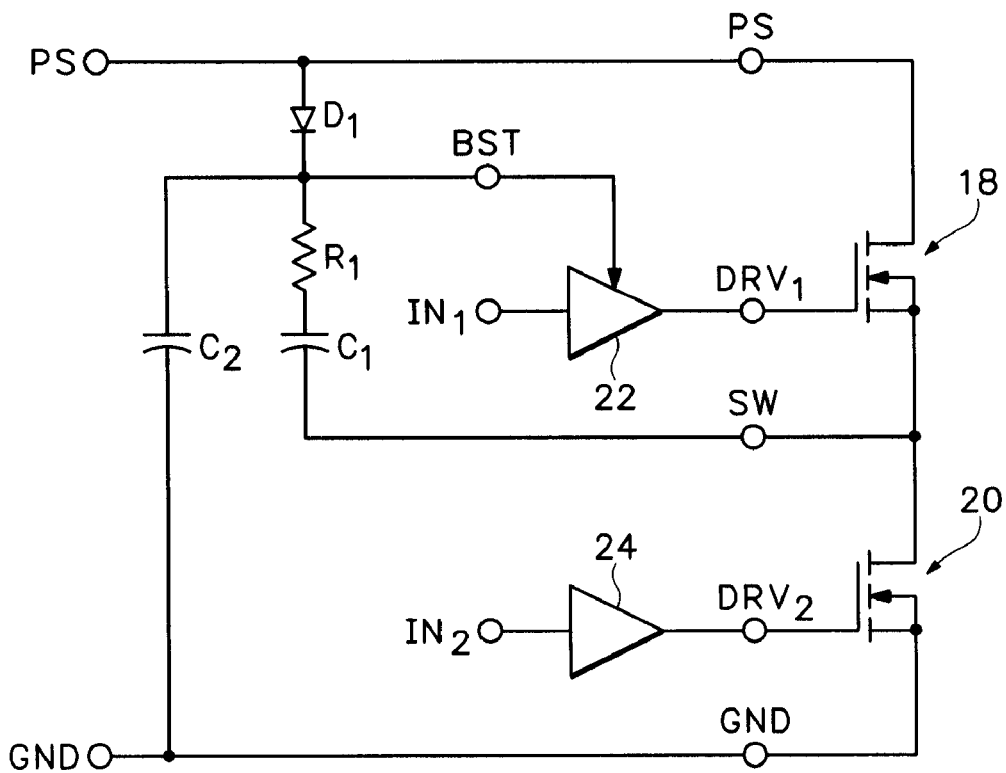
FIG. 4 illustrates an embodiment of a circuit showing some additional implementation details according to some of the inventive principles of this patent disclosure.

FIG. 4 illustrates an embodiment of a circuit showing some example implementation details according to some of the inventive principles of this patent disclosure. Switches 18 and 20 are implemented as metal oxide semiconductor field effect transistors (MOSFETs), but any other type of suitable switches may be used. Drive circuits 22 and 24 may be any suitable gate drivers. A boot-strap diode $D_1$ is connected between a power source node PS and a boost node BST. A capacitor $C_1$ is connected between the switch node SW and the boost node BST, preferably through a resistor $R_1$. A second capacitor $C_2$ is connected between BST and power supply GND. Capacitors C1 and C2 form a capacitive voltage divider that reduces the boost voltage $V_{BST}$ at boost node BST. The arrangement of components shown in FIG. 4 also provides snubbing at switch node SW which may transfer charge from the switch node SW to the boost circuit.

Depending on the details of implementation, the circuit of FIG. 4 may reduce switching losses because of the reduced voltage level of the boost signal $V_{BST}$ due to the voltage dividing effect of $C_1$ and $C_2$. It may also provide optimized slew-rate control when switch 18 is turned on because of the feedback from switch node SW to the boost node BST through $R_1/C_1$ and $C_2$. That is, the voltage at the gate of transistor 18 may ramp up quickly to turn the transistor on quickly, then final slew-rate control may reduce voltage spikes at the switch node SW. The snubbing of the SW node through the interaction of $R_1$ in series with the $C_1/C_2$ combination may provide better snubbing response than prior art methods because the snubbing is in the feedback of the driver. The arrangement of FIG. 4 may reduce stresses on some or all of the components, for example, the voltage stresses on the switches and the boot strap diode. The overall efficiencies that may be obtained from the circuit of FIG. 4 may, in turn, enable the use of fewer and/or lower cost switches and other components to be used. Yet another potential benefit of the circuit of FIG. 4 is that resistor $R_1$ may reduce stress by limiting current surges through the boot-strap diode. Because the boosting and snubbing functions are integrated into the same components, these potential benefits may be realized without additional components and their associated costs. A further potential benefit is that efficiency may be improved because charge that may have been wasted by shunting to ground may be preserved by transferring it to the boost node.

Although not necessary to an understanding of the inventive principles of this patent disclosure, some helpful equations relating to component values in FIG. 4 are provided as follows. The value of the capacitors may be determined from:

$$C_1 = 10 \times \frac{Q_{GATE}}{V_{CC} - V_D} \text{ and } C_2 = 10 \times \frac{Q_{GATE}}{V_{GATE}} - C_1$$

where $Q_{GATE}$ is the total charge required on the gate of switch 18 at the desired gate voltage $V_{GATE}$, $V_{CC}$ is the power supply voltage, and $V_D$ is the voltage drop across $D_1$. The peak surge current $I_{F(PEAK)}$ rating for the boot-strap diode may be determined from:

$$I_{F(PEAK)} = \frac{V_{CC} - V_D}{R_1}$$

The inventive principles of this patent disclosure have been described above with reference to some specific example embodiments, but these embodiments can be modified in arrangement and detail without departing from the inventive concepts. For example, switches have been shown in some embodiments as MOSFETS, but any other suitable switches may be used in accordance with the inventive principles of this patent disclosure. As a further example, the power supply and boosted signals are not limited to any particular polarity, voltage or switching power supply topology. As yet another example, resistor $R_1$ may be rearranged or omitted from the circuit of FIG. 4 while still maintaining beneficial results. And as yet another example, the arrangement of C2 may be between BST and other nodes besides GND. Thus, such changes and modifications are considered to fall within the scope of the following claims.

The invention claimed is:

1. A switching power supply control circuit comprising:
    a switch node configured for being coupled between two series coupled switches;
    a drive node configured for supplying a drive signal to drive a first switch of the two series coupled switches;
    a driver circuit configured to provide a drive signal to operably drive the first switch;
    a boost node operably coupled to provide power to the driver circuit;
    a power source node; and
    a boost circuit coupled to the switch node and the power source node to generate a boosted signal for providing a power source to the driver circuit for driving the first switch, wherein the boost circuit comprises a divider to limit the boosted signal;
    wherein the divider comprises:
        a first capacitor coupled between the boost node and a power supply node; and
        a second capacitor coupled between the boost node and the switch node.

2. The circuit of claim 1 wherein the divider further comprises a resistor coupled in series with one of the capacitors.

3. The circuit of claim 1 wherein the divider further comprises:
    a boot-strap diode coupled between the power source node and the boost node; and
    a resistor coupled in series with the boot-strap diode to limit current surges through the boot-strap diode.

4. A switching power supply control circuit comprising:
    a switch node configured for being coupled between two series coupled switches;
    a drive node configured for supplying a drive signal to drive a switch of the two series coupled switches;
    a driver circuit configured to provide a drive signal to operably drive the switch;
    a snubber circuit coupled to the switch node; and
    a boost circuit coupled to the switch node to generate a boosted signal for providing power to the driver circuit for driving the switch;
    wherein the snubber circuit is arranged to transfer charge from the switch node to the boost circuit and limit a value of the boosted signal; and
    wherein the snubber circuit comprises a capacitor and a resistor coupled between the switch node and the boost circuit.

5. The circuit of claim 4 wherein the capacitor and resistor are coupled to a boost node in the boost circuit.

6. The circuit of claim 5 wherein the capacitor and resistor are coupled in series.

7. The circuit of claim 5 wherein the boost circuit comprises a second capacitor coupled between the boost node and a power supply terminal.

8. A method for controlling a switching power supply comprising:
    configuring a driver circuit to form a drive signal to drive a switch coupled to a switch node and a drive node wherein the switch node is between two series coupled switches;
    generating a boosted signal wherein the driver circuit receives the boosted signal as a power source for operating the driver circuit; and
    transferring charge between two charge storage elements that are coupled to the driver circuit to reduce the voltage of the boosted signal.

9. The method of claim 8 wherein transferring charge comprises transferring charge between two capacitors.

10. The method of claim 8 wherein transferring charge comprises dividing a voltage.

11. The method of claim 8 further comprising transferring charge from the switch node to the drive node.

12. The method of claim 11 wherein transferring charge from the switch node to the drive node comprises transferring charge through a capacitor.

13. The method of claim 12 wherein transferring charge from the switch node to the drive node further comprises transferring charge through a resistor.

14. A switching power supply control circuit comprising:
a switch node configured for being coupled between two series coupled switches;
a drive node configured for supplying a drive signal to drive a first switch of the two series coupled switches;
a driver circuit configured to provide the drive signal to the drive node;
a boost node operably coupled to provide power to the driver circuit;
a power source node; and
a boost circuit coupled to the switch node and the power source node to generate a boosted signal for driving the switch, wherein the boost circuit comprises a charge divider to limit the boosted signal.

15. The circuit of claim 14 wherein the charge divider comprises a capacitor coupled between the boost node and a power supply node.

16. The circuit of claim 14 wherein the charge divider comprises a capacitor coupled between a boost node and the switch node.

17. The circuit of claim 14 wherein at least a portion of the divider is integral with a snubber circuit.

18. The circuit of claim 14 wherein the power source node is an input power source node.

19. A switching power supply control circuit comprising:
a switch node configured for being coupled between two series coupled switches;
a drive node configured for supplying a drive signal to drive a first switch of the two series coupled switches;
a driver circuit configured to provide a drive signal to operably drive the first switch;
a snubber circuit coupled to the switch node; and
a boost circuit coupled to the switch node to generate a boosted signal for operating the driver circuit;
wherein the snubber circuit is arranged to transfer charge from the switch node to the boost circuit.

20. The circuit of claim 19 wherein the snubber circuit is coupled in a feedback arrangement with the drive node.

21. A switching power supply control circuit comprising:
a switch node configured for being coupled between two series coupled switches;
a drive node configured for supplying a drive signal to drive a first switch of the two series coupled switches;
a driver circuit configured to provide a drive signal to operably drive the first switch;
a power source node;
means for generating a boosted signal for driving the switch; and
charge sharing means coupled to the means for generating the boosted signal for limiting the boosted signal.

22. The circuit of claim 21 further comprising means for snubbing the switch node.

23. The circuit of claim 22 wherein the means for snubbing the switch node is integral with the charge sharing means.

* * * * *

UNITED STATES PATENT AND TRADEMARK OFFICE
CERTIFICATE OF CORRECTION

| | | |
|---|---|---|
| PATENT NO. | : 7,592,718 B1 | Page 1 of 1 |
| APPLICATION NO. | : 10/976196 | |
| DATED | : September 22, 2009 | |
| INVENTOR(S) | : Tod F. Schiff | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 559 days.

Signed and Sealed this

Twenty-first Day of September, 2010

David J. Kappos
*Director of the United States Patent and Trademark Office*